(12) United States Patent
Yoshida

(10) Patent No.: US 10,564,210 B2
(45) Date of Patent: Feb. 18, 2020

(54) LIFE DETERMINATION DEVICE FOR DC CAPACITOR CONNECTED TO DC SIDE OF RECTIFIER

(71) Applicant: FANUC CORPORATION, Yamanashi (JP)

(72) Inventor: Tomokazu Yoshida, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 49 days.

(21) Appl. No.: 15/063,926

(22) Filed: Mar. 8, 2016

(65) Prior Publication Data

US 2016/0266189 A1    Sep. 15, 2016

(30) Foreign Application Priority Data

Mar. 10, 2015  (JP) .................................. 2015-047389

(51) Int. Cl.
*G01R 31/02* (2006.01)

(52) U.S. Cl.
CPC .................................. *G01R 31/028* (2013.01)

(58) Field of Classification Search
CPC .................................................. G01R 31/028
USPC ....................................................... 324/548
See application file for complete search history.

(56) References Cited

U.S. PATENT DOCUMENTS

| | | | |
|---|---|---|---|
| 5,804,973 A * | 9/1998 | Shinohara ........... | B60L 11/1807 324/537 |
| 9,444,373 B2 * | 9/2016 | Yamamoto .............. | H02P 1/022 |
| 2010/0079150 A1 * | 4/2010 | Hoffmann .............. | G11C 29/02 324/548 |
| 2010/0161259 A1 * | 6/2010 | Kim .................... | G05B 23/0283 702/63 |
| 2012/0025613 A1 | 2/2012 | Morita et al. | |

(Continued)

FOREIGN PATENT DOCUMENTS

| | | |
|---|---|---|
| DE | 102004040179 A1 | 3/2005 |
| DE | 102012017679 A1 | 3/2013 |

(Continued)

OTHER PUBLICATIONS

Untranslated Notification of Reasons for Refusal mailed by JPO, dated Jun. 28, 2016, 3 pages.
English machine translation of Notification of Reasons for Refusal mailed by JPO, dated Jun. 28, 2016, 3 pages.
Untranslated Decision to Grant a Patent mailed by JPO, dated Aug. 23, 2016, 3 pages.

(Continued)

*Primary Examiner* — Jeff W Natalini
(74) *Attorney, Agent, or Firm* — Fredrikson & Byron, P.A.

(57) ABSTRACT

A life determination device for a DC capacitor includes: a current detecting unit that detects a current outputted from a rectifier; a voltage detecting unit that detects a voltage of the DC capacitor; an initial charging device that performs initial charging of the DC capacitor up to a predetermined voltage value with the current outputted from the rectifier; a current integrating unit that integrates the current detected by the current detecting unit during a period of the initial charging; a capacitance estimating unit that calculates an estimated capacitance of the DC capacitor from the current integration value, the predetermined voltage value, and the voltage of the DC capacitor prior to the initial charging; and life determination unit that determines whether the DC capacitor is at the end of its life based on an initial capacitance value of the DC capacitor in an unused state and the estimated capacitance.

6 Claims, 8 Drawing Sheets

(56) References Cited

U.S. PATENT DOCUMENTS

| | | | | |
|---|---|---|---|---|
| 2012/0153966 | A1* | 6/2012 | Kawamura | G01R 31/028 324/548 |
| 2013/0293258 | A1* | 11/2013 | Lechat | H02M 1/32 324/764.01 |
| 2014/0210389 | A1* | 7/2014 | Niwa | H02P 3/12 318/400.3 |
| 2015/0198647 | A1* | 7/2015 | Atwood | G01R 31/2884 324/548 |

FOREIGN PATENT DOCUMENTS

| | | | |
|---|---|---|---|
| JP | 251365 | A | 2/1990 |
| JP | 3269268 | A | 11/1991 |
| JP | 2000152643 | A | 5/2000 |
| JP | 200298725 | A | 4/2002 |
| JP | 200817613 | A | 1/2008 |

OTHER PUBLICATIONS

English machine translation of Decision to Grant a Patent mailed by JPO, dated Aug. 23, 2016, 3 pages.

English Abstract and Machine Translation for German Publication No. 10 2012 017 679 A1 published Mar. 28, 2013, 6 pgs.

English Abstract and Machine Translation for German Publication No. 102004040179 A1 published Mar. 10, 2005, 12 pgs.

English Abstract for Japanese Publication No. 2008-017613 A, published Jan. 24, 2008, 2 pgs.

English Abstract for Japanese Publication No. 2002-098725 A, published Apr. 5, 2002, 2 pgs.

English Abstract for Japanese Publication No. 2000-152643 A, published May 30, 2000, 2 pgs.

English Abstract and Machine Translation for Japanese Publication No. 02-051365 A, published Feb. 21, 1990, 5 pgs.

English Abstract and Machine Translation for Japanese Publication No. 03-269268 A, published Nov. 29, 1991, 7 pgs.

\* cited by examiner

LIFE DETERMINATION DEVICE FOR DC CAPACITOR CONNECTED TO DC SIDE OF RECTIFIER

BACKGROUND OF THE INVENTION

1. Field of the Invention

The present invention relates to a life determination device for a DC capacitor connected to a DC side of a rectifier.

2. Description of the Related Art

In a motor control device for driving a motor of machine tools, an industrial machine, a forge rolling machine, an injection machine, or various robots, an AC power inputted from an AC power supply side is converted to a DC power, which in turn is converted to an AC power, and the converted AC power is used as driving power for a motor provided for each drive shaft.

FIG. 4 is a view illustrating the configuration of a general motor control device. The motor control device 100 includes a rectifier 101 that converts AC power from a commercial three-phase AC power supply 103 (hereinafter referred to simply as "power supply") to DC power, an inverter 102 that converts the DC power outputted from the rectifier 101 to AC power of a desired frequency to be supplied as driving power for a motor 104 or converts AC power regenerated from the motor 104 to DC power, and controls the speed or rotor position of the motor 104 connected to the AC side of the inverter 102. The rectifier 101 and the inverter 102 are connected via a direct current link (DC link. In the DC link is provided a DC capacitor (DC link capacitor) 105.

The DC capacitor 105 is generally known as a component having a limited life time of which electrostatic capacitance (hereinafter, referred to simply as "capacitance") is decreased by repeated charging and discharging. When the capacitance of the DC capacitor 105 is decreased, a problem arises that the ripple current flowing through the DC link is increased which results in increased fluctuations in the DC voltage. Thus, it is important to accurately grasp the capacitance of the DC capacitor 105 in order to determine whether the end of the life of the DC capacitor is reached. The DC capacitor 105, which is determined that the end of its life is reached, needs to be replaced.

As a technique for estimating the electrostatic capacitance of a DC capacitor provided in a DC link of a rectifier, there is a device for determining the life of a DC capacitor by measuring the charging time and the charging voltage when the DC capacitor is charged with a constant current, and comparing the result of the measurement with preset characteristics of the charging time and the charging voltage, as described in Japanese Unexamined Patent Publication No. 2008-17613, for example. FIG. 5 is a schematic view for explaining the invention described in Japanese Unexamined Patent Publication No. 2008-17613. Meanwhile, in FIG. 5, there are omitted the illustrations of an inverter connected to the rectifier 101 via the DC capacitor in the DC link and a motor driven by the inverter. In this device, there are provided switches SW1 and SW2, an inductor 106, and a DC capacitor charging control circuit 110 for charging the DC capacitor with a constant current I resulting from conversion by the rectifier 101 of an AC current from an AC power supply 103 to a DC current, and the measured charging time and charging voltage are compared with preset characteristics of the charging time and the charging voltage by a DC capacitance estimating circuit 111, thereby determining the life of the DC capacitor.

Further, there is a device that determines the life of a DC capacitor by charging and discharging the DC capacitor in a DC link by a charging circuit and a discharging circuit without using a complex charging control circuit, and measuring and comparing the charging time and the discharging time, as described in Japanese Unexamined Patent Publication No. 2002-98725, for example. FIG. 6 is a schematic view for explaining the invention described in Japanese Unexamined Patent Publication No. 2002-98725. Meanwhile, in FIG. 6, there are omitted illustrations of an inverter connected to a rectifier 101 via a DC capacitor in a DC link and a motor driven by the inverter. In this device, there are provided switches SW1 and SW2, a charging resistor 107, a discharging resistor 108, an inductor 106, and a DC capacitor charging and discharging control circuit 112 for charging and discharging a DC capacitor with a current I resulting from conversion by the rectifier 101 of an AC current from an AC power supply 103 to a DC current; the DC capacitor 105 is charged and discharged by these components; then the charging time and the discharging time are measured, and the measured charging time and discharging time are compared by a DC capacitor capacitance estimating circuit 113; and in this manner the life of the DC capacitor 105 is determined.

Further, there is a device that determines the life of a DC capacitor using a time-integral value of the charging current when the DC capacitor is charged and a voltage value of the DC capacitor, without being influenced by fluctuations in an AC power supply when the DC capacitor in a DC link is charged and changes in time constants of a charging circuit and a discharging circuit, as described in Japanese Unexamined Patent Publication No. 2000-152643, for example. FIG. 7 is a schematic view for explaining the invention described in Japanese Unexamined Patent Publication No. 2000-152643. Meanwhile, in FIG. 7, there are omitted the illustrations of an inverter connected to a rectifier 101 via the DC capacitor in the DC link and a motor driven by the inverter. In this device, there are provided a switch SW1, a charging resistor 107, and a DC capacitor charging control circuit 115 for charging the DC capacitor with a current I resulting from conversion by the rectifier 101 of an AC current from the AC power supply 103 to a DC current. In this regard, a charging current integrating circuit 116 time-integrates the charging current I during the charging period of the DC capacitor 105, and a DC capacitor capacitance estimating circuit 117 calculates an estimated capacitance C of the DC capacitor 105 from a resultant current integration value and a voltage V of the DC capacitor 105 based on equation (1) as follows:

$$C = \int I \, dt \div V \qquad (1)$$

Further, it is determined by a life determination circuit 118 whether the capacitance of the DC capacitor 105 is decreased as compared with the estimated capacitance C and a reference capacitance set by a reference value setting unit 119.

When the capacitance of the DC capacitor is decreased by repeated charging and discharging of the DC capacitor provided in the DC link at the DC output side of the rectifier as described above, a problem arises that the ripple current flowing through the DC link is increased so that fluctuations in the DC voltage become large; hence, it is important to accurately measure the capacitance of the DC capacitor. Failure to accurately measure the capacitance of the DC capacitor might lead to a possibility that the timing for replacing the DC capacitor is missed so that a large ripple current or DC voltage fluctuation is caused to occur in the DC link. Further, it might, alternatively, lead to a possibility that the DC capacitor, which has not yet reached the end of its life, is replaced unnecessarily early.

In the invention described in Japanese Unexamined Patent Publication No, 2008-17613, for example, a DC capacitor is charged with a constant current resulting from convention by a rectifier of an AC current from an AC power supply to a DC current, and hence there is a problem such that a plurality of switches, an inductor, and a DC charging control circuit must be provided so that the circuit arrangement is complicated. Further, there is a problem such that in order to apply such invention to an existing motor control device including a rectifier and an inverter connected to the rectifier via a DC link, the existing circuit configuration must be modified significantly.

Further, according to the invention described in Japanese Unexamined Patent Publication No. 2002-98725, for example, the DC capacitor charging control circuit does not become so complex, but since not only a charging circuit but also a discharging circuit must be provided, there is a problem such that in order to apply such invention to an existing motor control device, the circuit configuration must be modified significantly.

Further, according to the invention described in Japanese Unexamined Patent Publication No. 2002-98725, when the voltage of the AC power supply 103 is changed, the charging time is changed so that it is not possible to accurately determine the life of the DC capacitor. Further, when the time constants of the charging circuit and the discharging circuit are changed, too, the charging time and the discharging time are changed so that it is not possible to accurately determine the life of the DC capacitor. FIG. 8 is a view for explaining relationships between charging resistance and charging time in the invention described in Japanese Unexamiend Patent Publication No. 2002-98725. When the resistance value of the charging resistor 107 is changed, the charging time is also changed. For example, when the resistance value of the charging resistor 107 is decreased to be smaller than a normal value, the charging current becomes larger than when the resistance value is the normal value, so that the charging time $t_1$ becomes shorter than a normal charging time t. Further, when the resistance value of the charging resistor 107 is increased to be larger than the normal value, the charging current becomes smaller than when the resistance value is the normal value, so that the charging time $t_2$ becomes shorter than the normal charging time t. FIG. 9 is a view for explaining relationships between discharging resistance and discharging time in the invention described in Japanese Unexamined Patent Publication No. 2002-98725. When the value of the discharging resistor 108 is changed, the discharging time is also changed. For example, when the resistance value of the discharging resistor 108 is increased to be larger than the normal value, the amount of electric charges consumed by the discharging resistor 108 becomes smaller than when the resistance value is the normal value, so that the discharging time $t_4$ becomes longer than the normal discharging time t. Further, when the resistance value of the discharging resistor 108 is decreased to be smaller than the normal value, the amount of electric charges consumed by the discharging resistor 108 becomes larger than when the resistance value is the normal value, so that the discharging time $t_3$ becomes longer than the normal discharging time t. In this manner, according to the invention described in Japanese Unexamined Patent Publication No. 2002-98725, when the voltage of the AC power supply serving as a supply source of the charging current is changed, the charging time is changed, and when the time constants of the charging circuit and the discharging circuit are changed, the charging time and the discharging time are changed; thus, there is a problem that it is not possible to accurately determine the life of the DC capacitor.

Further, according to the invention described in Japanese Unexamined Patent Publication No. 2000-152643, for example, it is possible to determine the life of the DC capacitor, without being influenced by fluctuations in the AC power supply when charging the DC capacitor in the DC link and changes in time constants of the charging circuit and the discharging circuit. However, the capacitance of a DC capacitor typically has a dispersion of several tens % with respect to the nominal value; therefore, there is a fundamental problem that it is not possible to obtain an accurate determination result by a method for performing a life determination simply by comparing the capacitance of the DC capacitor with a certain reference capacitance. Further, when the capacitance of the DC capacitor is changed due to addition or removal of a device, replacement of a device or the like based on a system change, too, it is not possible to obtain an accurate determination result by a method for performing life determination by comparing the capacitance of the DC capacitor with a certain reference capacitance, and there is a problem that the reference capacitance to be used for life determination must be changed if it is attempted to obtain an accurate determination result.

FIG. 10 is a schematic view for explaining about a life determination when a device equipped with a DC capacitor is newly added in the invention described in Japanese Unexamined Patent Publication No. 2000-152643. When a device 120 equipped with a DC capacitor 105-1 is newly added to the circuit illustrated in FIG. 10, and on the assumption that the capacitance of the DC capacitor 105 is $C_1$ and the capacitance of the DC capacitor 105-1 is $C_2$, the combined capacitance "$C_1+C_2$" of the DC capacitor 105 and the DC capacitor 105-1 can be obtained by equation (2) as follows:

$$C_1+C_2 = \int Idt \div V \tag{2}$$

However, only from the combined capacitance "$C_1+C_2$" obtained from equation (2), it is not possible to determine to what extent the capacitance is decreased from the initial state. It may be considered to add the nominal value for the DC capacitor 105-1 to the so-far reference capacitance used to determine the life of the DC capacitor 105 and perform life determination with the resultant capacitance as a new reference capacitance, but since the capacitance of the DC capacitor has a dispersion of several tens % with respect to the nominal value as described above, the nominal value after the addition also includes a dispersion, and therefore it is not possible to achieve an accurate life determination.

SUMMARY OF THE INVENTION

In view of the above-described problems, it is an object of the present invention to provide a small-sized and low-cost life determination device for a DC capacitor which is capable of accurately determining the life of the DC capacitor connected to a DC side of a rectifier.

In order to achieve the foregoing object, the life determination device for the DC capacitor connected to the DC side of the rectifier includes: a current detecting unit that detects a current outputted from the rectifier; a voltage detecting unit that detects a voltage applied to the DC capacitor; an initial charging unit that performs initial-charging of the DC capacitor up to a predetermined voltage value with the current outputted from the rectifier; a current integrating unit that integrates, during a period of initial charging by the initial charging unit, the current detected by the current detecting unit and outputs the integrated current as a current integration value; a capacitance estimating unit that calculates an estimated capacitance of the DC capacitor from the current integration value, the predetermined voltage value, and the voltage of the DC capacitor detected by the voltage detecting unit prior to the initial charging; and a life determination unit that determines whether the DC capacitor is at the end of its life based on a pre-measured initial capacitance value of the DC capacitor in an unused state and the estimated capacitance calculated by the capacitance estimating unit.

The life determination unit may be configured to determine that the DC capacitor is at the end of its life when the ratio of the estimated capacitance to the initial capacitance is lower than or equal to a preset reference ratio.

The life determination unit may be configured to determine that the DC capacitor is at the end of its life when the estimated capacitance is smaller than or equal to a value obtained by multiplying the initial capacitance and the preset reference ratio.

Further, the DC capacitor life determination device may further include a reference ratio setting unit that sets the reference ratio.

Further, the DC capacitor life determination device may further include an alarm signal outputting unit that outputs an alarm signal when the life determination unit determines that the DC capacitor is at the end of its life.

Further, the DC capacitor life determination unit may further include an initial capacitance storage unit in which is stored a pre-measured initial capacitance of the DC capacitor in an unused state.

BRIEF DESCRIPTION OF THE DRAWINGS

The present invention will be more clearly understood by referring to the following accompanying drawing in which.

DETAILED DESCRIPTION

With reference to the drawings, description will be made hereinbelow of a life determination device of a DC capacitor that is connected to a DC side of a rectifier. However, it should be understood that the present invention is not limited to the drawings or embodiments which will be described hereinafter. The present invention is applied to a system in which a rectifier and an inverter are connected via a DC link in which a DC capacitor is provided. The present invention is applicable not only to a motor control device but also to any device of such a system configuration, and a load provided on an AC side of the inverter is not limited to a motor.

Figure 1:
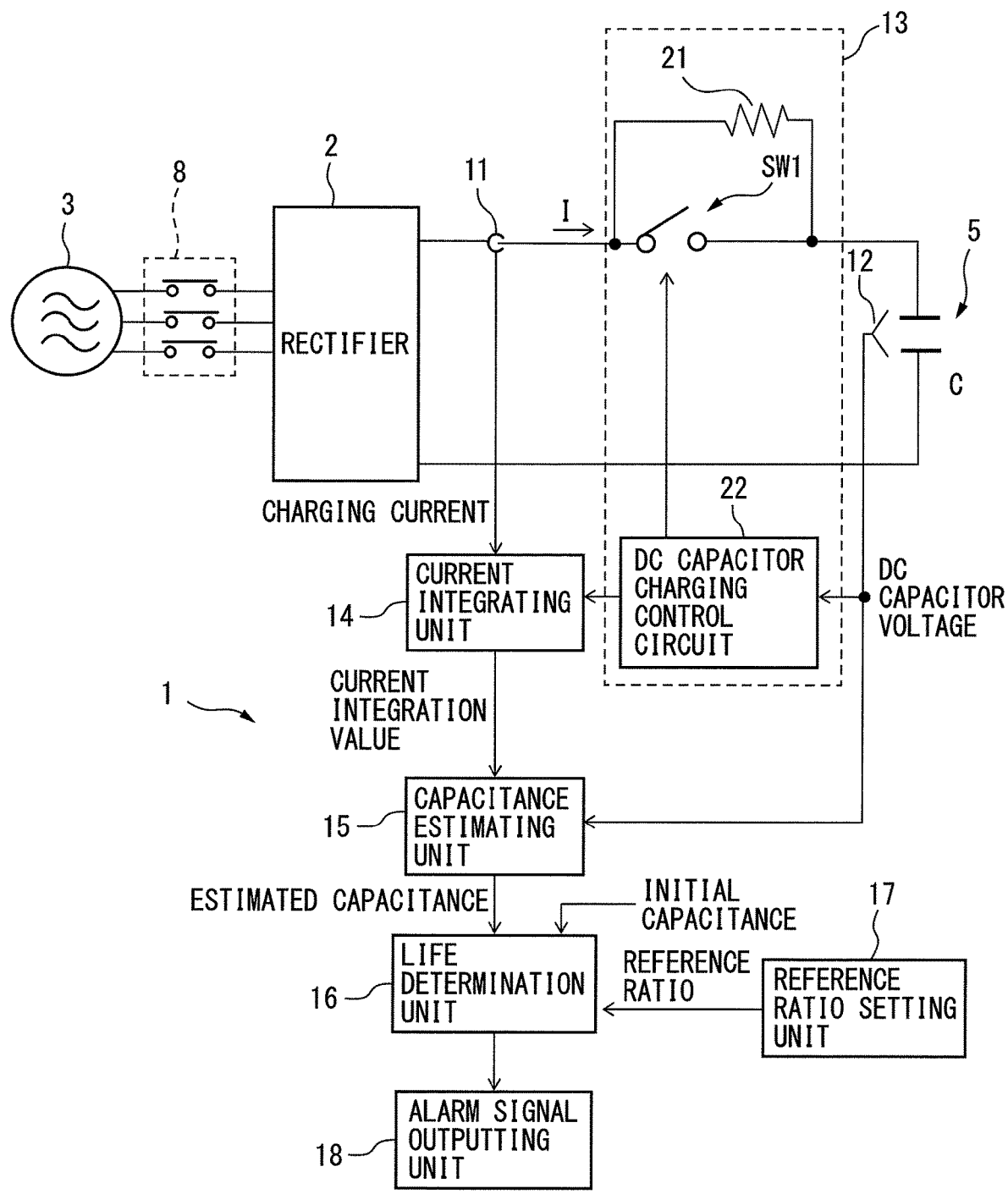
FIG. 1 is a principle block diagram illustrating a DC capacitor life determination device according to an embodiment of the present invention.

FIG. 1 is a principle block diagram illustrating a DC capacitor life determination device according to an embodiment of the present invention. Let it be assumed hereinafter that components denoted by identical reference numerals in different drawings refer to components having identical functions.

Description will be made hereinbelow of a case where the life of a DC capacitor 5 provided in a DC link on a DC output side of a rectifier 2 that converts an AC power from an AC power supply 3 to a DC power is determined by a DC capacitor life determination device 1 according to an embodiment of the present invention. While an inverter is connected to the rectifier 2 via a DC link and a motor, for example, is connected to the inverter as a load, there are omitted in FIG. 1 the illustrations of the inverter and the motor for the sake of simplicity of the drawing. On an AC input side of the rectifier 2 is provided an electromagnetic contactor 8. Meanwhile, the type of the rectifier 2 does not particularly limit the present invention, and may be a diode rectification type rectifier or a PWM control type rectifier.

First, description will be made of the circuit arrangement of the DC capacitor life determination device 1 according to the present embodiment.

The DC capacitor life determination device 1 includes a current detecting unit 11, a voltage detecting unit 12, an initial charging unit 13, a current integrating unit 14, a capacitance estimating unit 15, a life determining unit 16, a reference ratio setting unit 17, and an alarm signal outputting unit 18.

The current detecting unit 11 detects a current outputted from the rectifier 2.

The voltage detecting unit 12 detects a voltage applied to the DC capacitor 5.

The initial charging unit 13 initially charges the DC capacitor 5 to a predetermined voltage value with the current outputted from the rectifier 2. The initial charging unit 13 includes a charging resistor 21, a switch SW1, and a DC capacitor charging control circuit 22. The DC capacitor charging control circuit 22 controls the initial charging operation of the DC capacitor 5 by commanding turning on/off the switch SW1 based on the voltage of the DC capacitor 5 detected by the voltage detecting unit 12. The above-described "predetermined voltage value" is a voltage value set up beforehand for initial charging of the DC capacitor 5; in other words, the voltage value at the DC capacitor 5 after completion of the initial charging becomes the "predetermined voltage value". While a detailed description will be made hereinafter, the DC capacitor charging control circuit 22 starts an initial charging operation by turning off the switch SW1, and the DC capacitor charging control circuit 22 ends the initial charging operation by turning on the switch SW1 when the voltage of the DC capacitor 5 detected by the voltage detecting unit 12 reaches the "predetermined voltage value".

The current integrating unit 14 integrates the current detected by the current detecting unit 11, during the initial charging operation by the initial charging unit 13 and outputs the integrated current as a current integrator value.

The capacitance estimating unit 15 calculates an estimated capacitance of the DC capacitor 5 from the current integration value outputted from the current integrating unit 14, the above predetermined voltage value, and the voltage of the DC capacitor 5 detected by the voltage detecting unit 12 prior to the initial charging. Description will be made hereinafter regarding a specific method for calculating the estimated capacitance of the DC capacitor 5 by the capacitance estimation unit 15.

The life determination unit 16 determines whether the DC capacitor 5 is at the end of its life based on a pre-measured initial capacitance value of the DC capacitor 5 in an unused state and the estimated capacitance calculated by the capacitance estimating unit 15. Meanwhile, although not illustrated in the drawings, initial capacitance storage unit such, for example, as EEOROM may be provided in which is stored the pre-measured initial capacitance value of the DC capacitor in an unused state. Description will be made hereinafter of a specific method for determining the life of the DC capacitor 5 by the life determination unit 16.

The reference ratio setting unit 17 sets up a reference ratio to be used for life determination processing by the life determination unit 16. The reference ratio setting unit 17 has a function of user interface, such as a personal keyboard, touch panel, mouse, or the like, which enables the user to rewrite the reference ratio from outside arbitrarily. Alternatively, the reference ratio setting unit 17 may be configured of a variable resistor and a mechanical potentiometer for changing the resistance value of the variable resistor. The reference ratio set by the reference ratio setting unit 17 is stored in a storage unit (not illustrated). The reference ratio is read out of the storage unit by the life determination unit 16 and used for life determination processing.

The alarm signal outputting unit 18 outputs an alarm signal when the life determination unit determines that the DC capacitor 5 is at the end of its life (i.e., the end of its life is reached).

Subsequently, description will be made of the operating principle of life determination processing by the DC capacitor life determination device 1.

Figure 2:
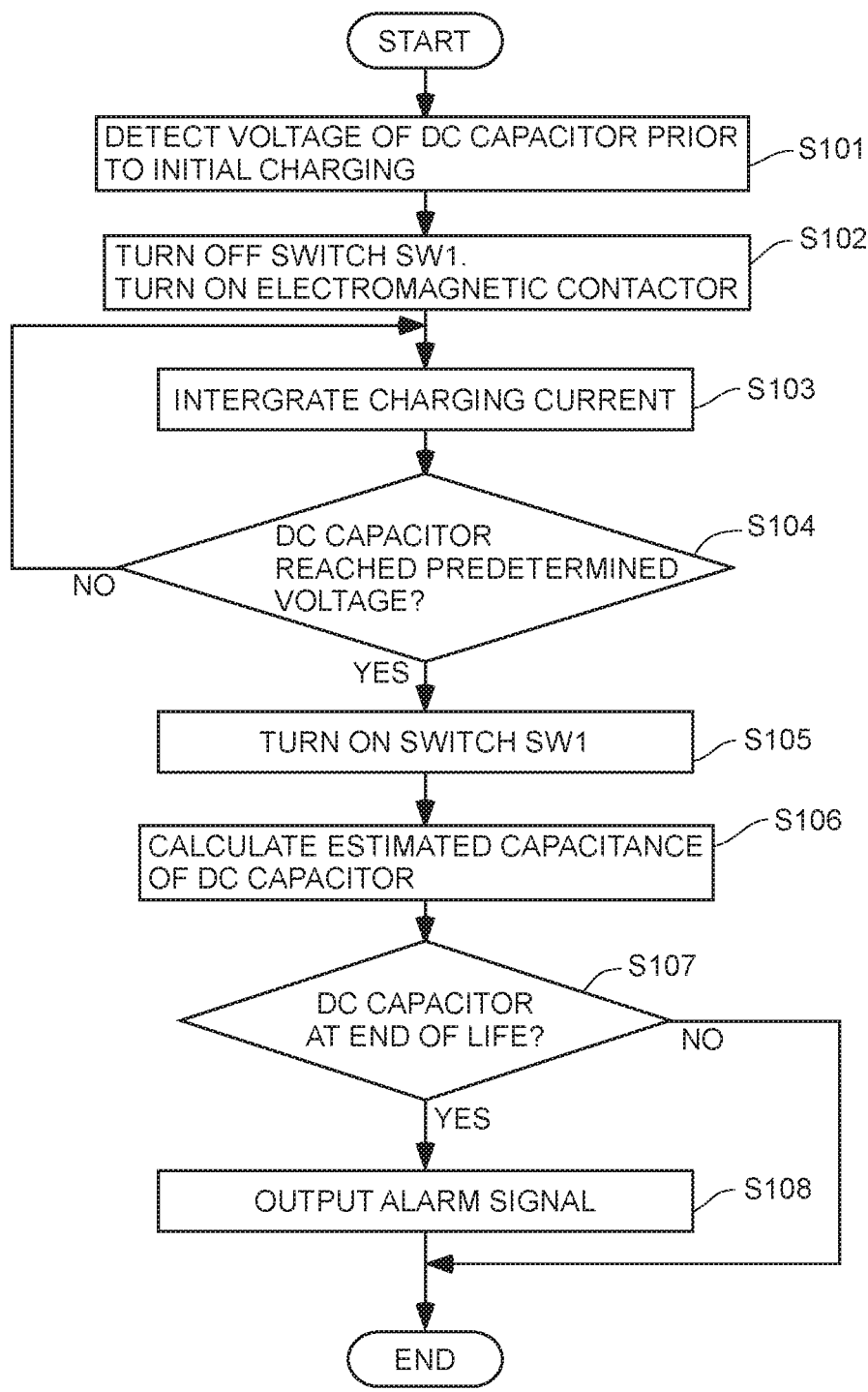
FIG. 2 is a flow chart illustrating a life determining process using the DC capacitor life determination device 1 according to the embodiment.

FIG. 2 is a flow chart illustrating the life determination processing using the DC capacitor life determination device 1 according to the embodiment.

First, at step S101, a voltage $V_0$ of the DC capacitor 5 is detected by the voltage detecting unit 12 before the DC capacitor 5 is initially charged.

Then an initial charging operation for the DC capacitor 5 by the initial charging unit 13 is started. Further, at step S102, the DC capacitor charging control circuit 22 in the initial charging unit 13 commands turning off the switch SW1 and turns on the electromagnetic contactor 8. In this manner, the rectifier 2 converts and outputs an AC current inputted from the AC power supply 3 into a DC current; the outputted DC current is caused to flow in the DC capacitor 5 through the charging resistor 21 so that the DC capacitor 5 is initially charged. Further, in conjunction therewith, the DC capacitor charging control circuit 22 notifies to the current integrating unit 14 that the initial charging is started.

Upon receipt of the notification from the DC capacitor charging control circuit 22 that the initial charging is started, at step S103, the current integrating unit 14 integrates the current detected by the current detecting unit 11. The current detected by the current detecting unit 11 during the initial charging period of the DC capacitor 5 will be referred to particularly as "charging current I" hereinafter.

At step S104, the DC capacitor charging control circuit 22 in the initial charging unit 13 determines whether the voltage detected by the voltage detecting unit 12 reaches a predetermined voltage value $V_1$ preset for the initial charging of the DC capacitor 5. When the voltage detected by the voltage detecting unit 12 does not reach the predetermined voltage value $V_1$, the procedure returns to step S103 so that the initial charging operation by the initial charging unit 13 is continued. Meanwhile, when the voltage detected by the voltage detecting unit 12 reaches the predetermined voltage value $V_1$, the procedure proceeds to step S105.

At step S105, the DC capacitor charging control circuit 22 commands turning on the switch SW1. In this manner, the initial charging operation of the DC capacitor 5 by the initial charging unit 13 is completed.

Subsequently, at step S106, the capacitance estimating unit 15 calculates an estimated capacitance $C_1$ of the DC capacitor 5 from a current integration value outputted from the current integrating unit 14, the above predetermined voltage value $V_1$, and a voltage $V_0$ of the DC capacitor 5 detected by the voltage detecting unit 12 prior to initial charging. Description will now be made of a method for calculating the estimated capacitance $C_1$ of the DC capacitor 5 by the capacitance estimating unit 15.

A remaining amount of charge $Q_0$ accumulated in the DC capacitor 5 prior to the initial charging operation can be expressed from the estimated capacitance $C_1$ of the DC capacitor 5 at the time of step S101, which is a time prior to the start of the initial charging operation by the initial charging unit 13, and the voltage $V_0$ of the DC capacitor 5 detected by the voltage detecting unit 12 at step S101, equation (3) as follows:

$$Q_0 = C_1 V_0 \tag{3}$$

An amount of charge $Q_1$ accumulated in the DC capacitor 5 at the time of step S105, which is after the completion of the initial charging operation by the initial charging unit 13, can be expressed by equation (4) as follows:

$$Q_1 = C_1 V_1 \tag{4}$$

Before and after the initial charging operation by the initial charging unit 13, an increased charge amount $\Delta Q$ of the DC capacitor 5 can be expressed by equation (5) as follows:

$$\Delta Q = Q_1 - Q_0 \tag{5}$$

Further, the current integration value obtained by the current integrating unit 14 integrating the charging current I during the initial charging period at step S103 represents an amount of electric charges accumulated due to the charging current I flowing in the DC capacitor 5, which is equal to the increased charge amount $\Delta Q$ of the DC capacitor 5, represented by equation (4). Thus, equation (6) holds true.

$$\Delta Q = Q_1 - Q_0 = \int I dt \tag{6}$$

Further, equation (7) can be derived by substituting equations (3) and (4) into equation (6) as follows:

$$C_1 = \frac{\int I dt}{V_1 - V_0} \quad (7)$$

Thus, based on equation (5), the capacitance estimating unit 15 calculates the estimated capacitance $C_1$ of the DC capacitor 5, from the current integration value outputted from the current integrating unit 14, the "predetermined voltage value" used for the initial charging by the initial charging unit 13, and the voltage of the DC capacitor 5 detected by voltage detecting unit 12 prior to the initial charging (step S106). Meanwhile, the result of the calculation by the capacitance estimating unit 15 may be displayed on a display (not illustrated) or stored in storage unit (not illustrated), for example. In this manner, the operator may know the estimated capacitance of the DC capacitor 5.

Returning to FIG. 2, at step S107, the life determination unit 16 determines whether the DC capacitor 5 is at the end of its life based on the pre-measured initial capacitance value $C_0$ of the DC capacitor 5 in an unused state, and the estimated capacitance $C_1$ calculated by the capacitance estimating unit 15. When it is determined that the DC capacitor 5 is at the end of its life (i.e., the end of its life is reached), the procedure proceeds to step S108. Description will now be made of a method for determining the life of the DC capacitor 5 by the life determination unit 16.

Generally, the DC capacitor 5 is such that its capacitance is decreased by repeated charging and discharging; therefore, in the present embodiment, the ratio of the estimated capacitance $C_1$ to the initial capacitance $C_0$ of the DC capacitor 5, or "$C_1/C_0$" is used as a criterion for determining whether the DC capacitor 5 is at the end of its life. Specifically, there are two methods as follows.

In a first method, when the ratio, "$C_1/C_0$", of the estimated capacitance $C_1$ to the initial capacitance $C_0$ is lower than or equal to the reference ratio preset by the reference ratio setting unit 17, the life determination unit 16 determines that the DC capacitor is at the end of its life (i.e., the end of its life is reached). Meanwhile, in a second method, when the estimated capacitance $C_1$ is smaller than or equal to a value obtained by multiplying the initial capacitance $C_0$ by the preset reference ratio, the life determination unit 16 determines that the DC capacitor 5 is at the end of its life (i.e., the end of its life is reached). The first and second methods are substantially the same; in the first method, the ratio of the capacitances of the DC capacitor is compared, while in the second method, the capacitance per se of the DC capacitor is compared.

Returning to FIG. 2, at step S108, the alarm signal outputting unit 18 outputs an alarm signal indicating that the DC capacitor 5 is at the end of its life (i.e., the end of its life is reached). The alarm signal may be utilized as follows. For example, in a system in which the rectifier and the inverter are connected via a DC link in which the DC capacitor is provided, it may be configured such that the entire operation of the system is stopped when a main control portion for performing overall control of the operation of the system receives an alarm signal from the alarm signal outputting unit 18. Further, for example, it may be configured such that when a speaker or buzzer emitting a sound receives an alarm signal, a sound to notify to the user is emitted. Further, for example, it may be configured such that when a personal computer or a portable terminal receives an alarm signal, it is displayed in a character or picture format on the display of such a device. Further, for example, it may be configured such that the date and time when an alarm signal was issued is stored in a storage device so as to be able to be utilized at a time of subsequent maintenance operation.

Meanwhile, although the reference ratio can be arbitrarily set by the user via the reference ratio setting unit 17, it may be possible that for example, a plurality of reference ratios are provided, a corresponding plurality of alarm signals are provided, and the result of life determination is divided into a plurality of levels such, for example, as "warning level", "alarm level", and the like.

Figure 3:
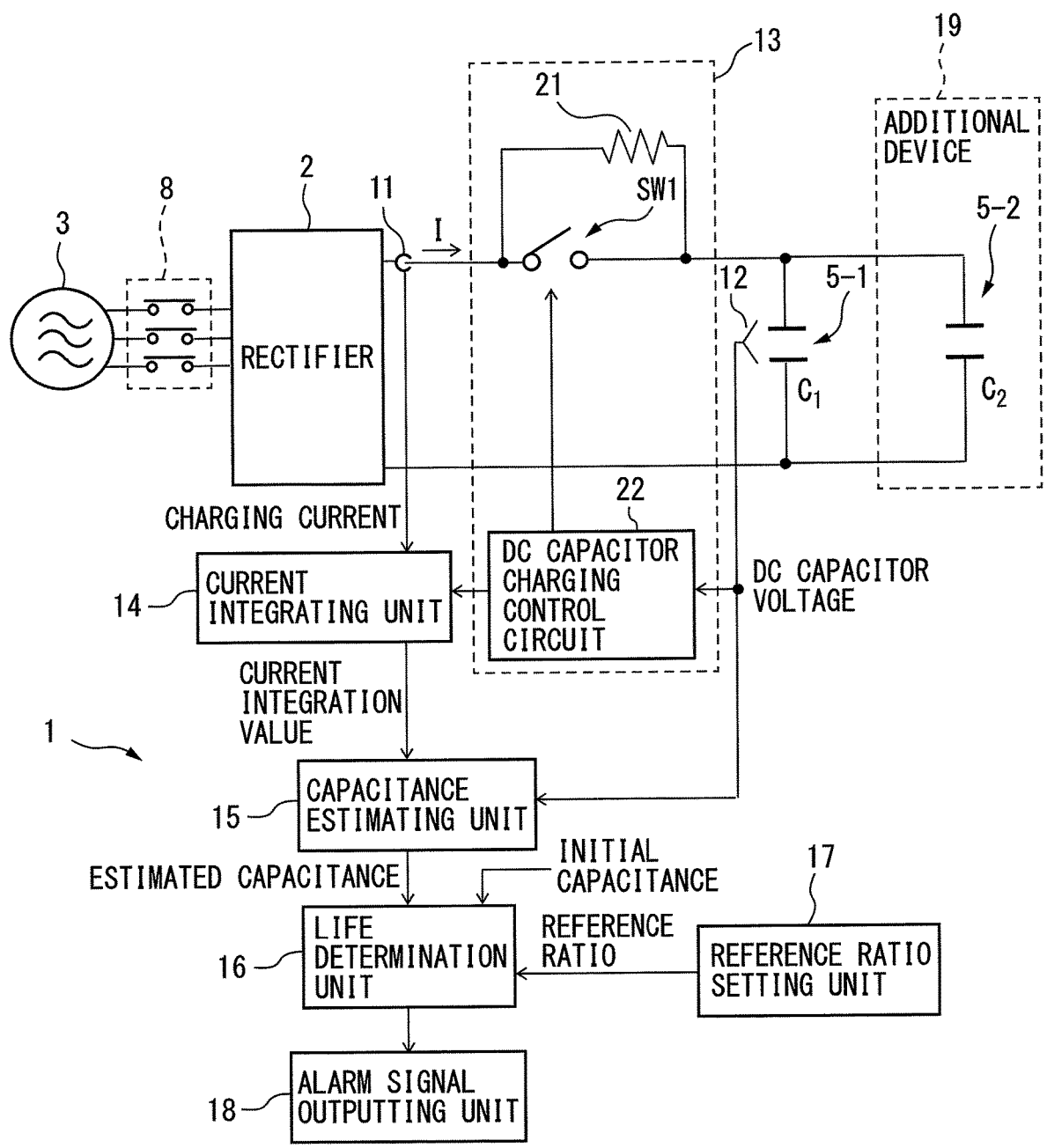
FIG. 3 is a view for explaining a capacitance estimation when a device equipped with a DC capacitor is newly added to the circuit illustrated in FIG. 1 in the embodiment.
Figure 4:
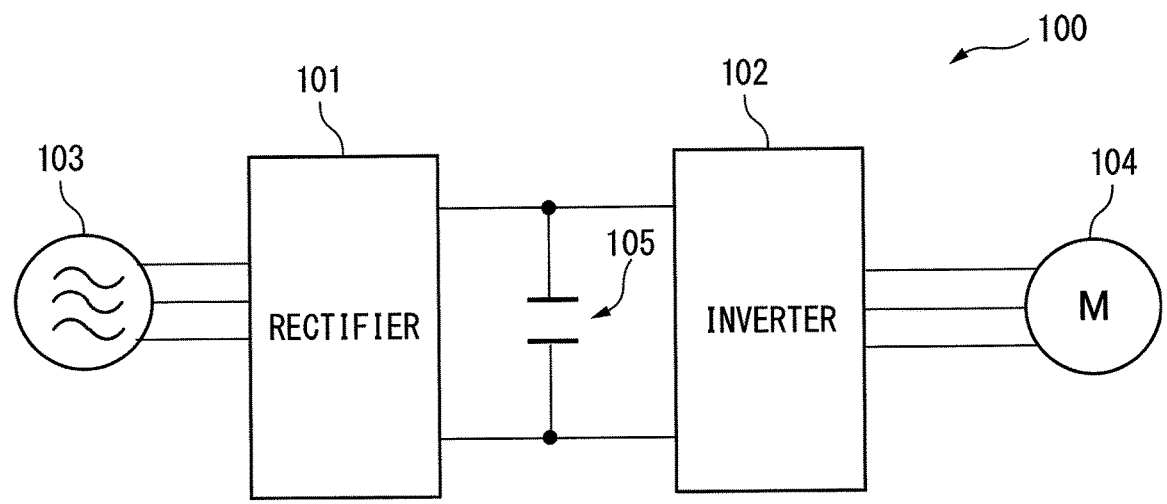
FIG. 4 is a view illustrating the configuration of a general motor control device.
Figure 5:
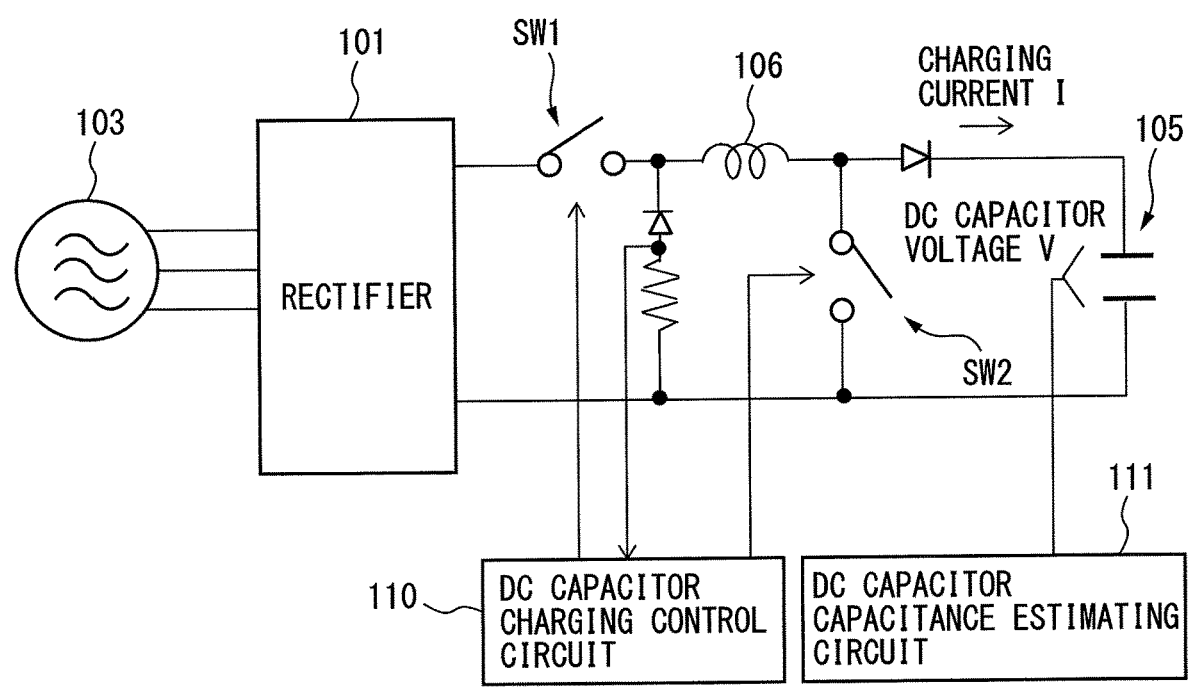
FIG. 5 is a schematic view for explaining the invention described in Japanese Unexamined Patent Publication No. 2008-17613.
Figure 6:
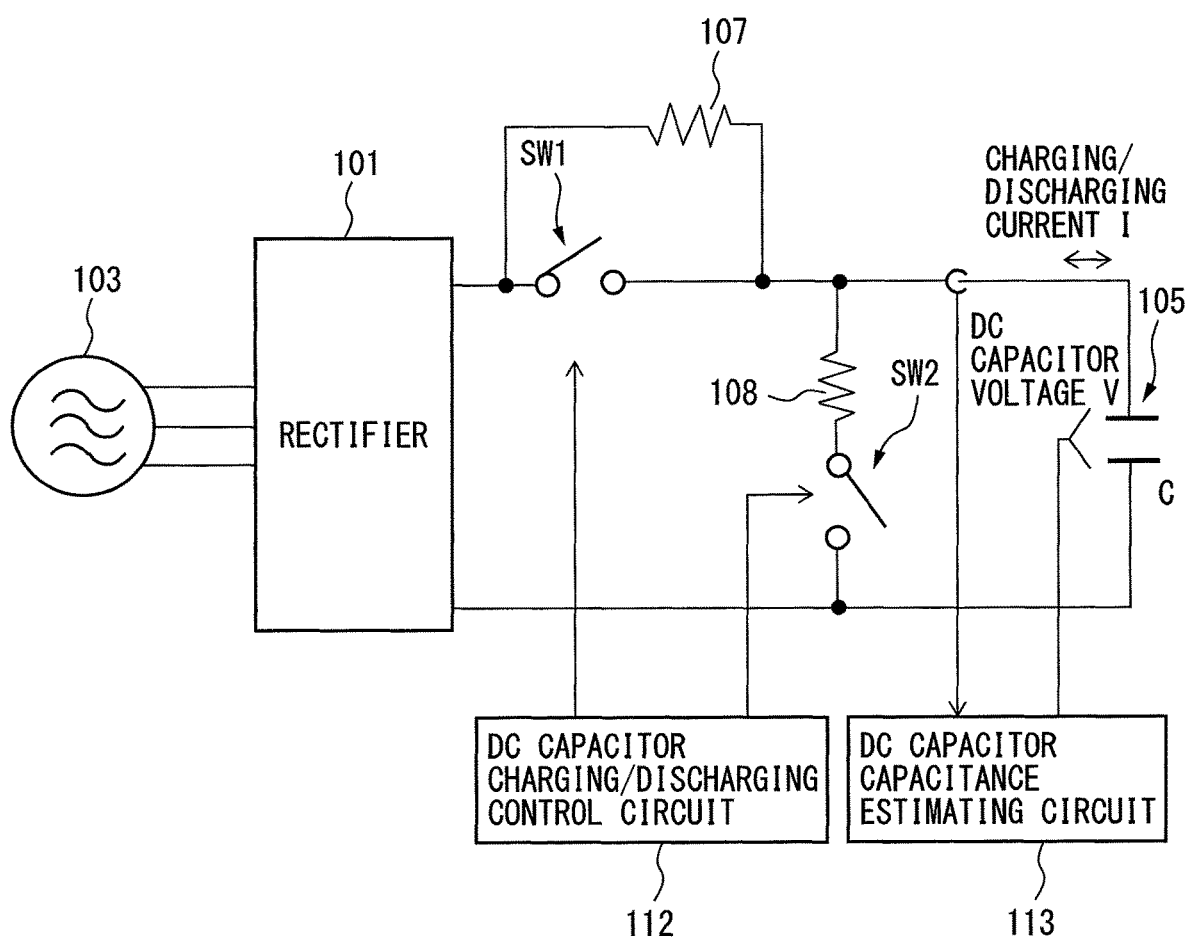
FIG. 6 is a schematic view for explaining the invention described in Japanese Unexamined Patent Publication No. 2002-98725.
Figure 7:
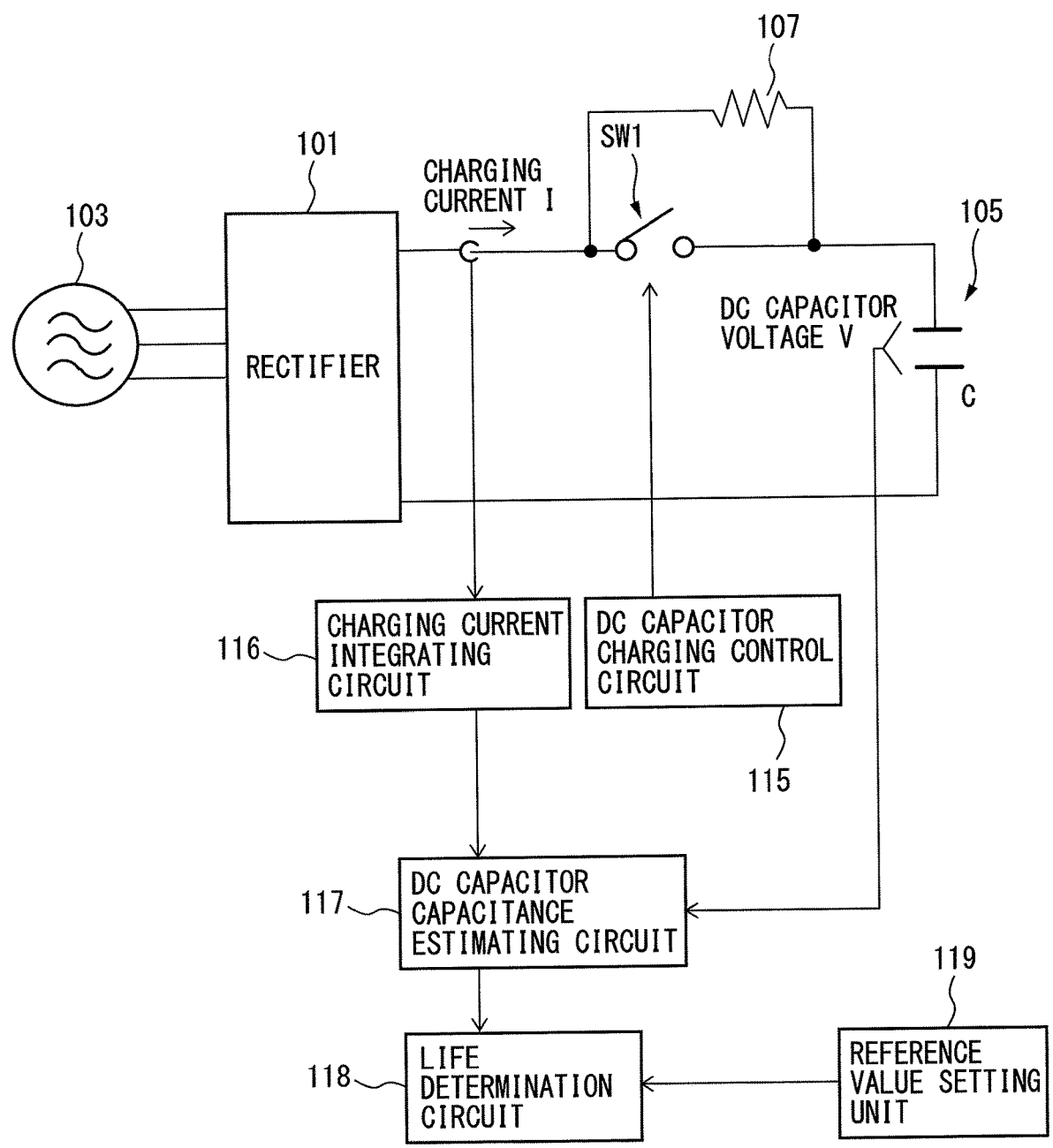
FIG. 7 is a schematic view for explaining the invention described in Japanese Unexamined Patent Publication No. 2000-152643.
Figure 8:
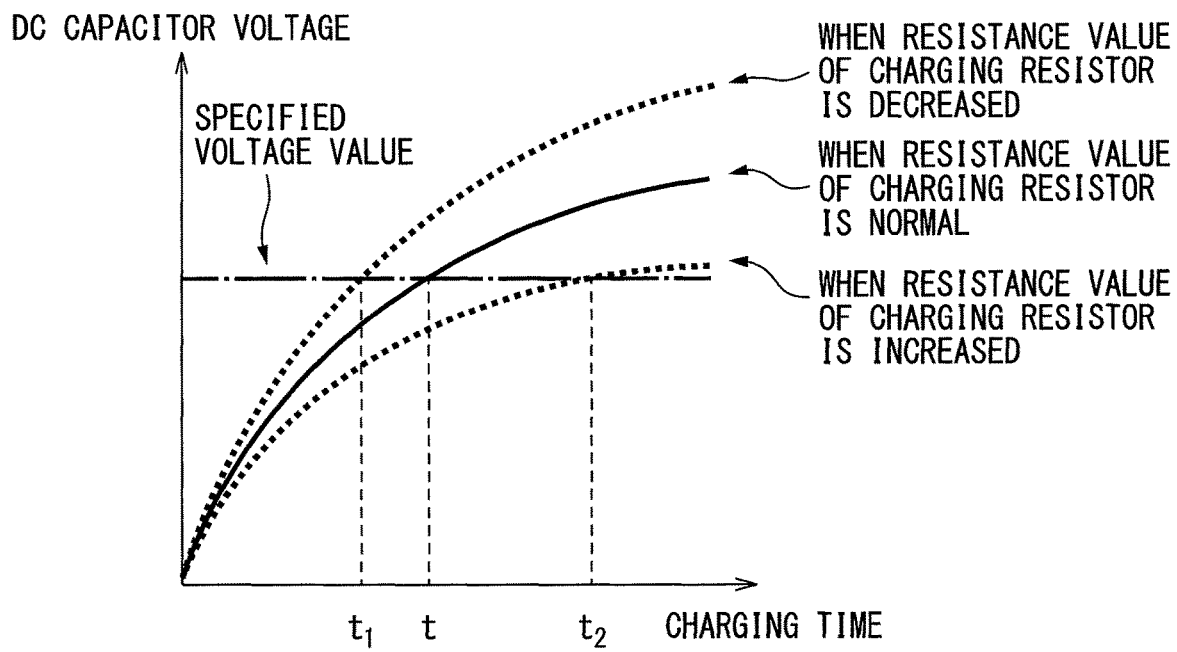
FIG. 8 is a view for explaining the relationship between charging resistance and charging time in the invention described in Japanese Unexamined Patent Publication No. 2002-98725.
Figure 9:
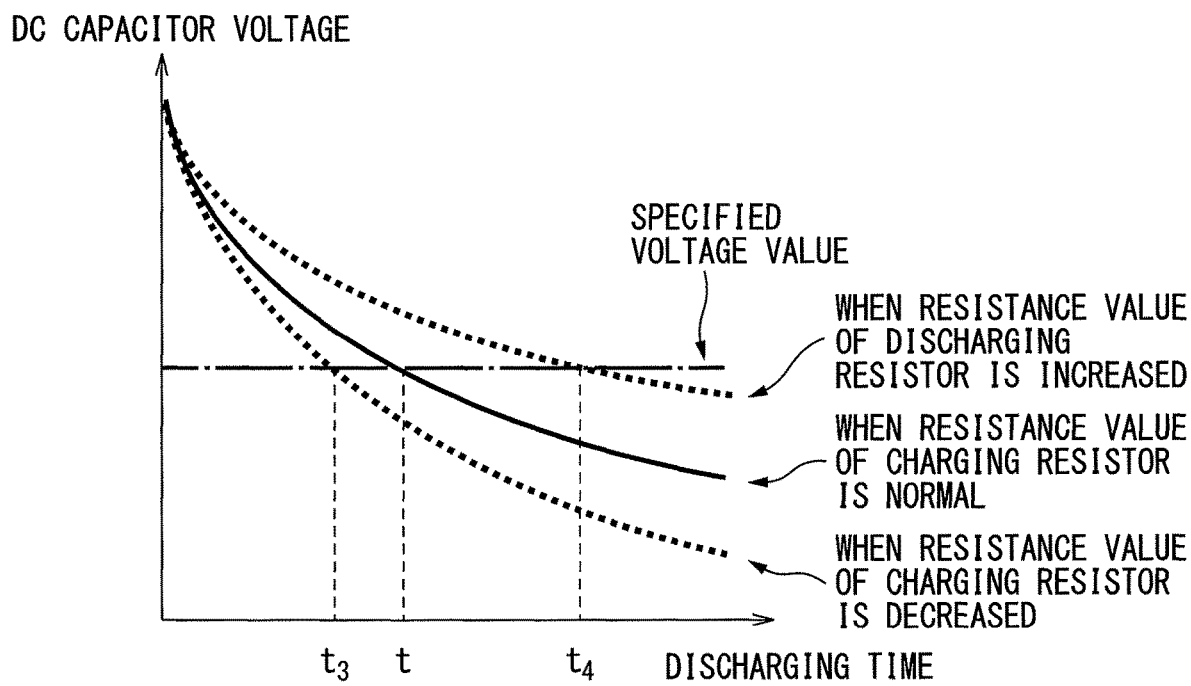
FIG. 9 is a view for explaining a relationship between discharging resistance and discharging time in the invention described in Japanese Unexamined Patent Publication No. 2002-98725.
Figure 10:
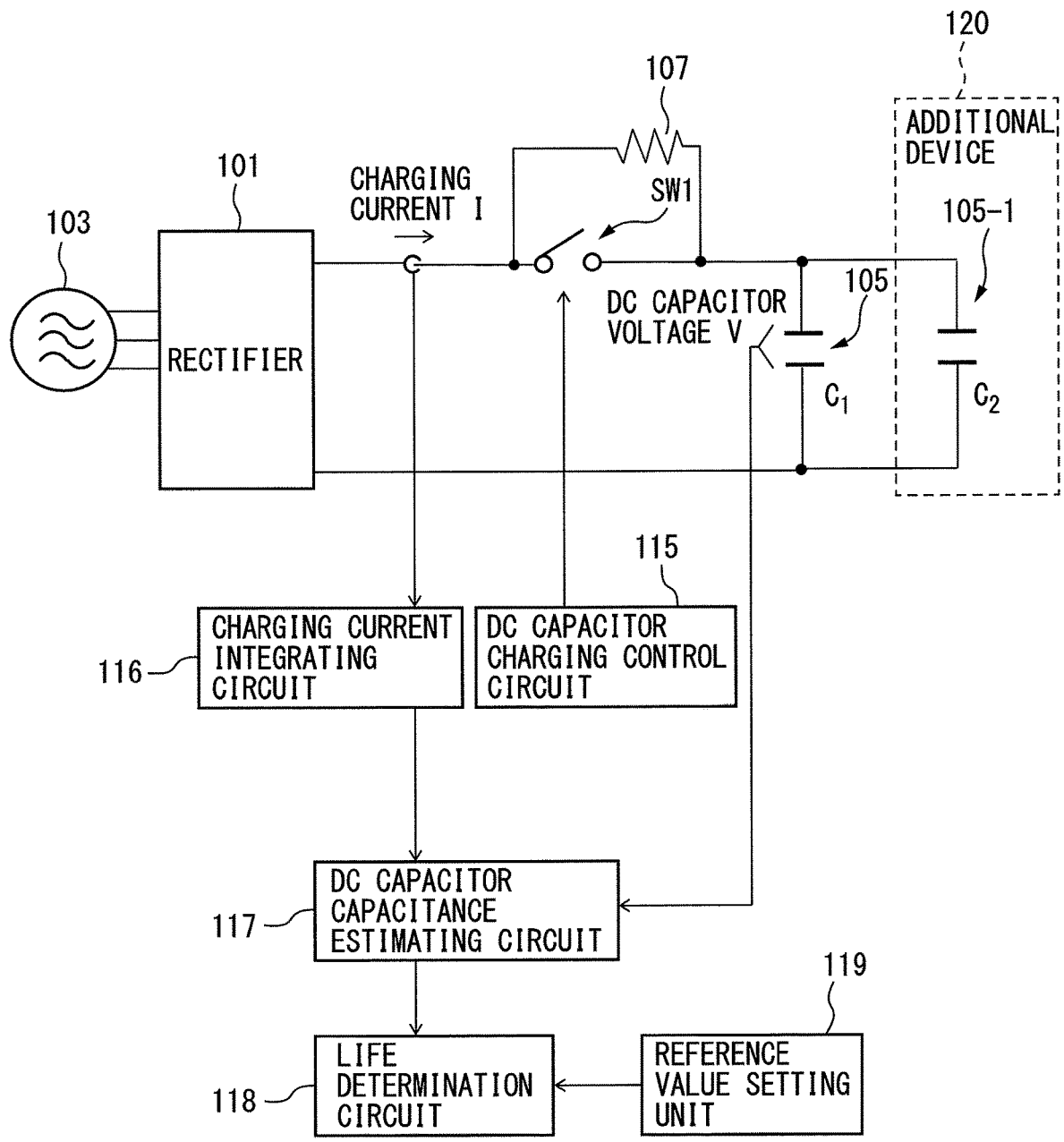
FIG. 10 is a schematic view for explaining a life determination when a device equipped with a DC capacitor is newly added in the invention described in Japanese Unexamined Patent Publication No. 2000-152643.

Description will now be made of a capacitance estimation for a case where a device including a DC capacitor is newly added. FIG. 3 is a view for explaining the capacitance estimation for a case were a device equipped with a DC capacitor is newly added to the circuit illustrated in FIG. 1 in the embodiment. When the system is changed in that a device 19 equipped with a DC capacitor 5-2 is newly added to a DC capacitor 5-1 as illustrated in FIG. 3, and on the assumption that the capacitance of the DC capacitor 5-1 is $C_1$ and the capacitance of the added DC capacitor 5-2 is $C_2$, the combined capacitance of the DC capacitor 5-1 and the DC capacitor 5-2 becomes "$C_1+C_2$" since the DC capacitors 5-1 and the DC capacitor 5-2 are connected in parallel to each other. Further, since the DC capacitors 5-1 and the DC capacitor 5-2 are connected in parallel to each other, the "predetermined voltage values" used for initial charging the DC capacitor 5-1 and the DC capacitor 5-2 by the initial charging unit 13 become the same (in other words, the voltage values after completion of the initial charging become the same) so that the voltages detected by the voltage detecting unit 12 prior to the initial charging also become the same between the DC capacitor 5-1 and the DC capacitor 5-2. Thus, the capacitance $C_2$ of the DC capacitor 5-2 is equal to the right side of equation (7) representing the capacitance $C_1$ of the DC capacitor 5-1. Therefore, the combined capacitance "C1+C2" of the DC capacitor 5-1 and the DC capacitor 5-2 can be obtained by equation (8) as follows:

$$C_1 + C_2 = \frac{\int I dt}{V_1 - V_0} \quad (8)$$

As can be seen from equation (8), in spite of the DC capacitor 5-2 of the capacitance $C_2$ being newly added to the DC capacitor 5-1 of the capacitance $C_1$, the capacitance estimating unit 15 can estimate the combined capacitance "$C_1+C_2$" of the DC capacitor 5-1 and the DC capacitor 5-2 from the current integration value outputted from the current integrating unit 14, the "predetermined voltage value" used for the initial charging by the initial charging unit 13, and the voltage of the DC capacitor 5 detected by the voltage detecting unit 12 prior to the initial charging, as in the case in which the DC capacitor 5-1 of the capacitance $C_1$ is used alone. In this manner, according to the present embodiment, it is possible to estimate the combined capacitance also when a device equipped with a DC capacitor is newly added. Further, in this instance, the life determination unit 16 determines whether the DC capacitors 5-1 and 5-2 are at the end of their life, based on the combined capacitance "$C_{01}+C_{02}$" of the pre-measured initial capacitance value $C_{01}$ of the DC capacitor 5-1 in an unused state and the initial capacitance value $C_{02}$ of the DC capacitor 5-2 and the estimated capacitance "$C_1+C_2$", which is the combined capacitance calculated by the capacitance estimating unit 15.

Meanwhile, while description has been made of the case of the two-parallel arrangement in which the DC capacitor 5-2 of the capacitance $C_2$ is connected in parallel to the DC capacitor 5-1 of the capacitance $C_1$, the combined capacitance estimation processing and the life determination processing are similar in principle also in the case in which three or more DC capacitors are parallel. It is also possible to easily estimate the capacitance based on similar principle when some of the plurality of DC capacitors are eliminated.

However, according to the present invention, although the combined capacitance of plural parallel DC capacitors can be estimated, the capacitance of an individual capacitor cannot be estimated by a single calculation process. In this instance, by calculating the estimated capacitance at each time when a device equipped with a DC capacitor is newly added or removed, for example, and seeking the difference in estimated capacitance before and after the calculation, the estimated capacitance of the added or removed DC capacitor can be obtained, so that it is possible to determine the life of the added or removed DC capacitor as well.

Meanwhile, the above-described current integrating unit 14, the capacitance estimating unit 15, the life determination unit 16, the reference ratio setting unit 17, the alarm signal outputting unit 18, and the DC capacitor charging control circuit 22 may be configured in the form of software program forms or in a combination of various types of electronic circuitry and software programs, for example. For example, when these unit and circuits are configured in the form of software programs, the functions of the above respective units are realized by causing an arithmetic processing unit to operate in accordance with the software programs, which is provided in a system in which a rectifier and an inverter are connected via a DC link in which a DC capacitor is provided. Further, the present invention may also be applied by additionally installing the software programs associated with these unit and circuits in the arithmetic processing unit in an existing system.

According to the present invention, it is possible to achieve a small-sized and low-cost DC capacitor life determination device that is capable of accurately determining the life of a DC capacitor connected to the DC side of a rectifier.

According to the invention described in Japanese Unexamined Patent Publication NO. 2008-17613, for example, in order to charge a DC capacitor, it is necessary to provide a complex charging control circuit, such as including a plurality of switches, inductors, and a DC capacitor charging control circuit, while according to the present invention, it is possible to determine the life of a DC capacitor using a general charging resistor, without additionally providing such a complex charging control circuit, thereby achieving the features of small size and low cost. Further, even when the present invention is applied to an existing device configured of a rectifier and an inverter connected to the rectifier via a DC link, there is no need to greatly modify the existing circuit arrangement.

Further, according to the present invention, contrary to the invention described in Japanese Unexamined Patent Publication No. 2002-98725, DC capacitor life determination using a charging time and a discharging time is not performed, so that even when the time constant of the charging circuit and/or that of the discharging circuit is changed, it is possible to accurately determine the life of the DC capacitor.

According to the invention described in Japanese Unexamined Patent Publication No. 2000-152643, for example, life determination is performed based on a nominal value of the capacitance of the DC capacitor with a dispersion on the order of several tens %, so that an accurate determination result cannot be obtained. In contrast, according to the present invention, the capacitance of the DC capacitor is estimated from the current integration value outputted from the current integrating unit and the predetermined voltage value used for initial charging by the initial charging unit (the voltage value after the initial charging), and the life of the DC capacitor is determined based on the estimated capacitance and the initial capacitance of the DC capacitor, so that the life determination can be accurately performed, without depending on the dispersion of the nominal value of the DC capacitor.

Further, according to the present invention, it is possible to accurately determine the life of the DC capacitor without making a special design change, even when the system is changed in a manner such that a device equipped with a DC capacitor is newly added or removed.

What is claimed is:

1. A life determination device for a DC capacitor connected to a DC side of a rectifier, the life determination device comprising:
   a current detecting unit that detects a current outputted from the rectifier;
   a voltage detecting unit that detects a voltage applied to the DC capacitor;
   an initial charging unit that performs initial charging of the DC capacitor up to a predetermined voltage value with the current outputted from the rectifier;
   a current integrating unit that integrates, during a period of initial charging by the initial charging unit, the current detected by the current detecting unit and outputs the integrated current as a current integration value;
   a capacitance estimating unit that calculates an estimated capacitance of the DC capacitor from the current integration value, the predetermined voltage value and the voltage of the DC capacitor detected by the voltage detecting unit prior to the initial charging; and
   a life determination unit that determines whether the DC capacitor is at the end of its life based on a pre-measured initial capacitance value of the DC capacitor in an unused state and the estimated capacitance calculated by the capacitance estimating unit, wherein the current detecting unit is operatively coupled to an AC power supply by the rectifier and the initial charging unit performs initial charging of the DC capacitor with current supplied directly from the AC power supply through the rectifier to the initial charging unit until the DC capacitor reaches the predetermined voltage value.

2. The life determination device for the DC capacitor according to claim 1, wherein the life determination unit determines that the DC capacitor is at the end of its life when the ratio of the estimated capacitance to the initial capacitance is lower than or equal to a preset reference ratio.

3. The life determination device for the DC capacitor according to claim 2, wherein the life determination device further comprises a reference ratio setting unit that sets the reference ratio.

4. The life determination device for the DC capacitor according to claim 2, wherein the life determination device further comprises an alarm signal outputting unit that outputs an alarm signal when the life determination unit determines that the DC capacitor is at the end of its life.

5. The life determination device for the DC capacitor according to claim 1, wherein the life determination unit determines that the DC capacitor is at the end of its life when the estimated capacitance is smaller than or equal to a value obtained by multiplying the initial capacitance and the preset reference ratio.

6. The life determination device for the DC capacitor according to claim 1, wherein the life determination device further comprises an initial capacitance storage unit in which is stored a pre-measured initial capacitance of the DC capacitor in an unused state.

\* \* \* \* \*